United States Patent [19]

Minarik et al.

[11] Patent Number: 4,654,608
[45] Date of Patent: Mar. 31, 1987

[54] DOUBLE SIDEBAND GENERATION WITH SERRODYNE MODULATORS

[75] Inventors: Ronald W. Minarik, Lutherville; Frederick H. Harris, Crofton; John W. Gipprich, Millersville, all of Md.

[73] Assignee: The United States of America as represented by the Secretary of the Air Force, Washington, D.C.

[21] Appl. No.: 825,107

[22] Filed: Feb. 3, 1986

[51] Int. Cl.$^4$ .............................................. H03C 1/52
[52] U.S. Cl. ...................................... 332/44; 332/41; 375/61
[58] Field of Search .................. 332/41, 44, 45, 48; 375/43, 61; 455/109

[56] References Cited

U.S. PATENT DOCUMENTS

| | | | |
|---|---|---|---|
| 2,462,852 | 3/1949 | Frankel | 179/171.5 |
| 2,566,876 | 9/1951 | Dome | 332/45 |
| 3,320,552 | 5/1967 | Glasser | 332/23 |
| 3,496,491 | 2/1970 | Krause | 332/44 |
| 3,562,671 | 2/1971 | Honma et al. | 332/9 |
| 3,940,716 | 2/1976 | Gehring | 332/44 X |

Primary Examiner—Eugene R. LaRoche
Assistant Examiner—Robert J. Pascal
Attorney, Agent, or Firm—William Stepanishen; Donald J. Singer

[57] ABSTRACT

A double sideband suppressed carrier modulator apparatus for combining two serrodyne (i.e., single sideband) modulators to achieve double sideband, suppressed carrier modulation. An RF input signal is divided into two carrier signals which are 90 degrees out of phase and applied to the serrodyne modulator units. The modulated signals from the modulators are combined in a 90 degree power divider to provide a double sideband suppressed carrier modulated output signal.

10 Claims, 10 Drawing Figures

DOUBLE SIDEBAND GENERATION WITH SERRODYNE MODULATORS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an RF modulator apparatus, and in particular to double sideband generation with serrodyne modulators.

The state of the art of RF signal modulators is well represented and alleviated to some degree by the prior art apparatus and approaches which are contained in the following U.S. patents:

U.S. Pat. No. 2,462,852 issued to Frankel on Mar. 1, 1949;

U.S. Pat. No. 2,566,876 issued to Dome on Sept. 4, 1951;

U.S. Pat. No. 3,320,552 issued to Glasser on May 16, 1967; and,

U.S. Pat. No. 3,562,671 issued to Takamicki Honma et al on Feb. 9, 1971.

U.S. Pat. No. 2,462,852 discloses a frequency modulation system for producing voltage undulations of a generally sawtooth pattern. U.S. Pat. No. 2,566,876 discloses a phase shift system for obtaining from a single source of voltage two resultant voltages which are constant in amplitude, but which differ in phase by a substantially constant phase angle. U.S. Pat. No. 3,562,671 discloses a pulse position modulation system which includes means for suppressing zero-modulation signal components. U.S. Pat. No. 3,320,552 discloses a band limited frequency modulation system for generating a bandwidth limited frequency modulated signal.

In FIG. 1 there is shown a graphical representation of the output spectrum of a double sideband, suppressed-carrier modulator (DSBSC), wherein the RF carrier is at the frequency, f(RF) and the lower and upper sidebands are at the frequencies, f(LSB) and f(USB), respectively. The upper and lower sideband frequencies are offset from the carrier frequency, f(RF) by the modulation frequency, f(MOD). In addition, there is shown the spurious products that are generated during the modulation process. It will be noted that in the prior art, various circuit configurations of the type of modulator that will produce this typical frequency spectrum can be readily found. There is also readily available a number of prior art circuit configurations that permit double sideband generation with the carrier and unwanted sideband levels of lower than −10 dBc dBc (referenced to the shifted carrier), where the actual suppression values are primarily dependent upon carrier bandwidth and operating temperature range.

If suppression values below −25 dBc are required, the conventional prior art double sideband modulation techniques, such as the double-balanced ring modulators or balanced attenuators, cannot be effectively utilized. Furthermore, the commonly known sophisticated schemes that use combinations of the conventional modulation approaches to meet the higher values of suppression are complex and expensive as well as completely unproven when using the presently available production technology.

It is possible to obtain carrier and sideband suppression below −25 dBc by using the digital serrodyne approach which is shown in FIG. 2. In this prior art approach, individual phase bits are switched into the RF path in order to produce the upconversion or downconversion serrodyne patterns that are respectively shown in FIGS. 3a and 3b. It is well-known in the present state of the art, that the carrier may be shifted by the serrodyne modulation rate and that the unwanted sideband level is primarily dependent upon the resolution of the phase steps. For example: 3-bit (i.e. 45 degree) phase steps will suppress unwanted sidebands by more than 16 dB whereas 6-bit resolution is necessary to achieve sideband suppression greater than 32 dB. Unfortunately, the modulation is only single sideband and there is no simple way of producing double sideband generation with a serrodyne modulator. The present invention provides a unique circuit combination of serrodyne frequency modulators to address the problem of generating double sideband suppressed carrier modulation when using serrodyne modulators.

SUMMARY OF THE INVENTION

The present invention utilizes a pair of single sideband serrodyne frequency modulators to achieve double sideband generation with carrier and unwanted sideband suppression that is characteristic of the individual single sideband serrodyne modulator. The RF input signal is applied to a 90 degree 3 dB hybrid power divider to obtain two RF carrier signals that are 90 degrees out of phase. One of the RF carrier signals is applied to the first single sideband serrodyne modulators which is used to frequency shift the drive signal above the RF carrier signal. The other serrodyne modulator is used to frequency shift the drive signal below the RF carrier signal. The output signals from the individual modulators which are 90 degrees out of phase, are then combined in a second 90 degree 3 dB hybrid power divider to obtain the upper and lower sidebands at the output. In order to achieve true double sideband, suppressed-carrier operation, the modulating frequencies to each serrodyne modulator would be the same, but out of phase.

It is one object of the present invention, therefore, to provide an improved serrodyne modulator apparatus.

It is another object of the invention to provide an improved modulator apparatus wherein two single sideband serrodyne frequency modulators are utilized to provide double sideband with carrier and unwanted sideband suppression.

It is another object of the invention to provide an improved modulator apparatus wherein either upper or lower sideband generation may be obtained.

It is another object of the invention to provide an improved modulator apparatus wherein single sideband operation is achieved by utilizing the same modulator input signal.

These and other advantages, objects and features of the invention will become more apparent after considering the following description taken in conjunction with the illustrative embodiment in the accompanying drawings.

DESCRIPTION OF THE PREFERRED EMBODIMENT

Figure 4:
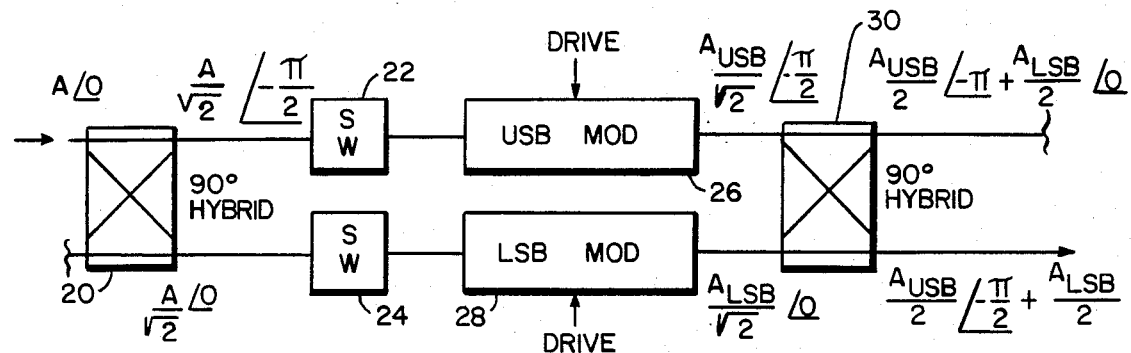
FIG. 4 is a block diagram of the double sideband suppressed carrier modulator apparatus according to the present invention.

Turning now to FIG. 4, there is shown a block diagram of a double sideband suppressed carrier modulator apparatus. An input carrier signal, $A \lfloor 0$ is applied to the input part of a first 90 degree hybrid power divider 20. The output signals which appear at the output parts of the 90 degree hybrid power divider 20, are 90 degrees out of phase. One of the output signals ($\lfloor -\pi/2$) is applied to a first switch unit 22. The other output signal ($\lfloor 0$) is applied to a second switch unit 24. The output of the first switch unit 22 is connected to the input of the upper sideband modulator unit 26. The output of the second switch unit 24 is connected to the input of the lower sideband modulator unit 28. Both the upper and lower sideband modulator units 26, 28 receive a drive signal to modulate their respective RF carrier input signals. The drive signals to the modulator units 26, 28 may be either the same or common, or they may differ from each other by some predetermined phase factor. The modulated output signal from each modulator unit 26, 28 is applied respectively to an input port of the second 90 degree hybrid power divider unit 30. The output signal at the output port of the second 90 degree hybrid power divider unit 30. The output signal at the output port of the second 90 degree hybrid power divider unit 30 is a modulated signal which contains the upper and lower sidebands with carrier suppression.

Figure 1:
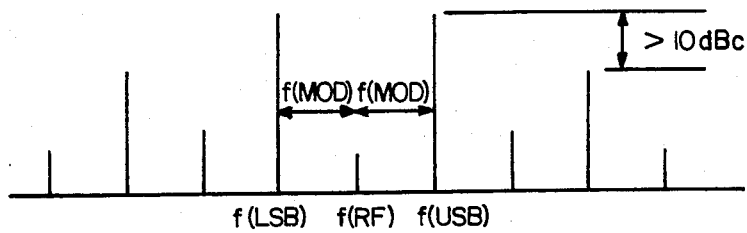
FIG. 1 is a graphical representation of the output spectrum of a double sideband, suppressed carrier modulator.
Figure 2:
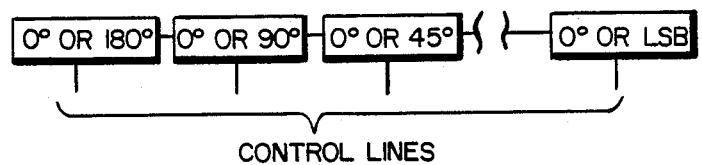
FIG. 2 is a block diagram of the digital approach to serrodyne modulators.
Figure 3A:
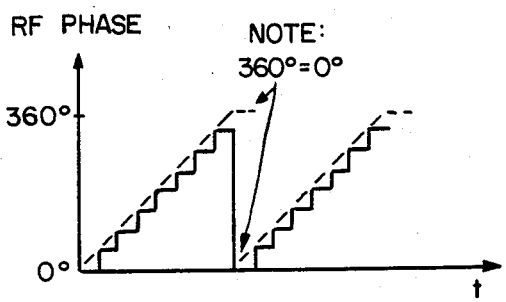
FIGS. 3a and 3b are graphical representations respectively of upper and lower sideband generation.
Figure 3B:
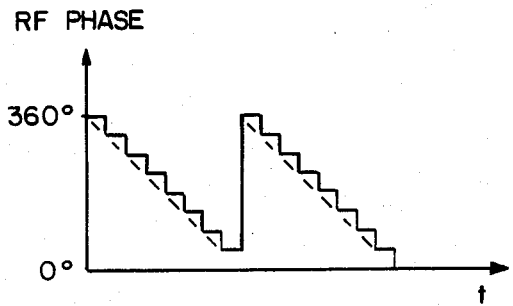

An example of the manner in which the present modulator apparatus utilizes two single sideband serrodyne frequency modulators in order to achieve double sideband generation with carrier and unwanted sideband suppression that is characteristic of the individual single sideband serrodyne modulator is as follows. The modulator apparatus as shown in FIG. 4 utilizes the input RF carrier which is first split with a 90 degree 3 dB hybrid power divider and fed into two individual single sideband serrodyne modulators. One of the modulators is operated to frequency shift the signal above the carrier while the other modulator is used to frequency shift the signal below the carrier. The signals from the individual modulators are then combined in a second 90 degree 3 dB hybrid power divider to obtain the upper and lower sidebands at the output of the double sideband suppressed carrier modulator apparatus. In order to achieve the true double sideband, suppressed-carrier operation as shown in FIG. 1, the modulating frequencies (the drive signal of FIG. 4) to each serrodyne modulator would be the same frequency but have a phase difference between them. However, there is no reason why the two signal offsets cannot be completely independent with regard to frequency shift that is warranted by system operation. In fact, depending upon the situation or application, the offsets can be either both upper sideband or both lower sideband. It should be noted that the use of the present apparatus and modulating technique, there is a 3 dB loss through each hybrid so that each offset is 6 dB below the input signal (not including additional insertion loss through the modulators or the hybrids). In the circuit configuration that is utilized in FIG. 4, an RF switch unit 22, 24 is respectively used in each circuit arm such that a single sideband signal can be generated by blocking off the signal to one of the modulators. By using this type of switch circuit configuration, the single sideband loss is also 6 dB which includes the insertion loss through the modulators and hybrids.

Figure 5:
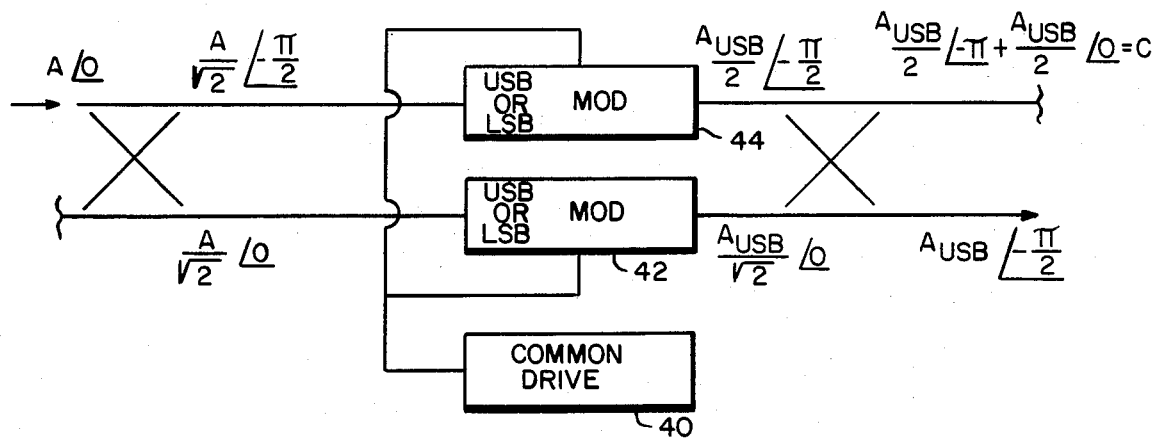
FIG. 5 is a block diagram of a single sideband modulator apparatus without switching units.

Referring now to FIG. 5, there is shown a block diagram of the double sideband suppressed carrier modulation apparatus wherein the two switch units of FIG. 4 are eliminated. A common drive unit 40 is shown applying a drive signal to the modulator units 42, 44. In order to produce single sideband operation in this case, each modulator unit 42, 44 is merely driven with the same modulation input. The modulator units 42, 44 both may be either lower sideband modulators or upper sideband modulators to either down or up convert the applied RF signal. In this case, the shifted carrier signal is equal to the RF input less the insertion loss through the hybrids power divider units and the modulators. The 6 dB hybrid loss is not experienced because the signals through each modulator unit 42, 44 are recombined in phase in the second hybrid power divider unit. Some unwanted sideband suppression may be lost (relative to single sideband suppression) when the outputs from the two modulators are combined but this reduction in suppression should be minimal (typically no greater than 1 or 2 dB) because the highest sideband for each of the two paths will not occur at the same frequency and, therefore, not add to give a worst case 6 dB reduction in carrier suppression.

Figure 6:
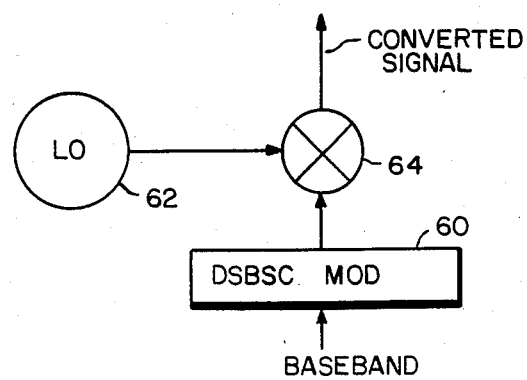
FIGS. 6 and 7 are block diagram respectively of different circuit configurations that utilize the double sideband suppressed carrier modulator apparatus, and, FIGS. 8a and 8b are graphical representations respectively of the output signals from the apparatus of FIGS. 6 and 7.
Figure 7:
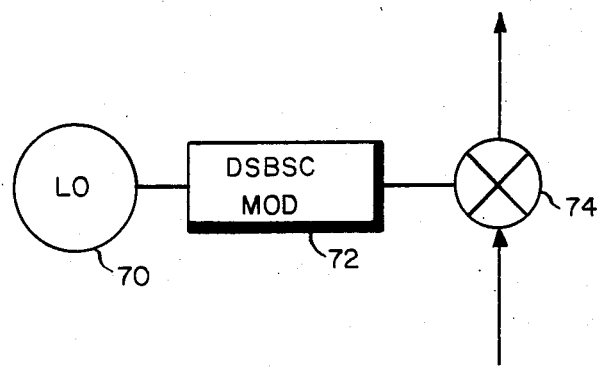

In FIGS. 6 and 7 there is shown block diagrams of circuit applications that utilize the double sideband suppressed carrier modulator apparatus in different circuit configurations. The present invention discloses a method for achieving double sideband, suppressed carrier modulation with the excellent sideband suppression that is afforded by a single sideband serrodyne modulator. In general, the modulation signal can be placed directly on the carrier signal. However, in many systems applications, the double sideband modulation is produced at a baseband or subcarrier frequency as shown in FIG. 6. In FIG. 6, the baseband signal is applied to the double sideband suppressed carrier modulator unit 60. The output of the modulator unit 60 is applied to the converter unit 64. The output of the local oscillator 62 is applied directly to the converter unit 64. The output of the converter unit 64 is the converted signal as shown.

In FIG. 7, there is shown a circuit configuration in which the output of the local oscillator unit 70 is applied directly to the double sideband suppressed carrier modulator unit 72. The output from the modulator unit 72 is applied directly to the converter unit 74. The baseband signal is applied to the converter unit 74 which converts the applied signals to an output signal (converted signal). In FIG. 7, the single or double sideband frequency offsets are placed on a local oscillator (LO) signal that is fed to a converter knit 74. The input signal to the converter unit 74 is not only converted to the new frequency via the signal from the local oscillator unit 70, but also receives the same frequency offset that is placed upon the local oscillator signal. Since the "carrier" for the frequency modulation is the local oscillator signal itself, each serrodyne modulator must only work over a relatively narrow band, thereby permitting the theoretical limits of sideband suppression to be achieved.

Figure 8A:
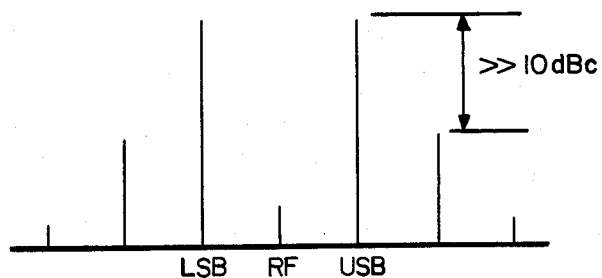
Figure 8B:
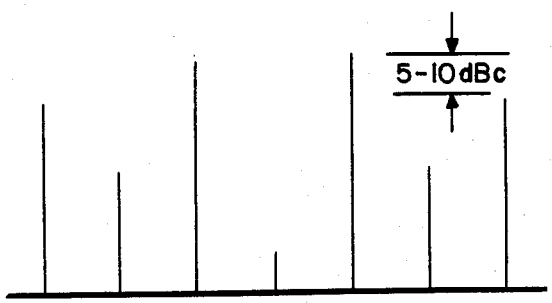

The specific system circuit configurations, as shown in FIGS. 6 and 7, utilize the same important aspect of the invention but in a different manner. If the input to the converter unit in FIG. 7 varies over a relatively wide dynamic range, and power leveling of this input signal is not permitted for system considerations, the local oscillator must then necessarily be the source of a strong (i.e., biasing) signal to the upconverter. In this case, the modulating signal which is applied to the local oscillator signal, can only be single sideband, because a strong double sideband signal (as shown in FIG. 8a) that is supplied to the converter unit will lose much of the unwanted sideband suppression (as shown in FIG. 8b) after the conversion takes place.

In an alternative situation, some systems require or employ input signals to converter unit that may be power leveled, i.e., only the frequency information in the signal is important. In this case, the circuit configuration which is disclosed in FIG. 7, may utilize the local oscillator unit to provide the weak signal and the double sideband modulation placed upon the local oscillator signal will remain linear in the conversion process so that the full suppression as achieved in FIG. 8a is also achieved for the converted signal.

Although the invention has been described with reference to a particular embodiment, it will be understood to those skilled in the art that the invention is capable of a variety of alternative embodiments within the spirit and scope of the appended claims.

What is claimed is:

1. A double sideband suppressed carrier modulator apparatus comprising in combination:
    a first means for dividing power, said first power dividing means receiving an input RF signal, said first power dividing means providing first and second carrier signals, said first and second carrier signals having a predetermined phase difference therebetween,
    a first modulator means operatively connected to said first power dividing means to receive said first carrier signals therefrom, said first modulating means comprising a serrodyne modulator, said first modulator means receiving a first modulation drive signal, to modulate said first carrier signal, said first modulator means providing a first modulated signal,
    a second modulator means operatively connected to said first power dividing means to receive said second carrier signals therefrom, said second modulation means comprising a serrodyne modulator, said modulator means receiving a second modulation drive signal to modulate said second carrier signals, said second modulator means providing a second modulated signal, and,
    a second means for dividing power, said second power dividing means operatively connected to said first and second modulator means to respectively receive said first and second modulated signal therefrom, said second power dividing means combining said first and second modulated signals to provide a modulated output signal, said modulated output signal including the upper and lower sidebands respectively of said first and second modulated signals.

2. A modulator apparatus as described in claim 1 further including a first and second switch means, said first switch means operatively connected between said first power dividing means and said first modulating means, said second switch means operatively connected between said first power dividing means and said second modulating means, said first and second switch means being operated to respectively control the signal flow to said first and second modulating means by blocking off the signal to one of the modulators in order to control the upper and lower sidebands in said modulated output signal.

3. A modulator apparatus as described in claim 1 wherein said first and second drive signals are provided by a common drive means.

4. A modulator apparatus as described in claim 1 wherein said first and second drive signals have a predetermined phase difference therebetween.

5. A modulator apparatus as described in claim 1 wherein said predetermined phase difference between said first and second carrier signals is 90 degrees.

6. A modulator apparatus as described in claim 1 wherein said first and second power dividing means respectively comprise 90 degree 3 dB hybrid power divider units.

7. A modulator apparatus as described in claim 1 wherein said predetermined phase difference between said first and second carrier signals is zero.

8. A modulator apparatus as described in claim 3 wherein said first and second drive signals have different frequencies.

9. A modulator apparatus as described in claim 4 wherein said predetermined phase difference between said first and second drive signals is 90 degrees.

10. A modulator apparatus as described in claim 4 wherein said predetermined phase difference between said first and second drive signals is zero degrees.

* * * * *